(12) United States Patent
Ganai

(10) Patent No.: US 8,532,971 B2
(45) Date of Patent: Sep. 10, 2013

(54) DPLL-BASED SAT SOLVER USING WITH APPLICATION-AWARE BRANCHING

(75) Inventor: Malay K. Ganai, Plainsboro, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 467 days.

(21) Appl. No.: 12/872,797

(22) Filed: Aug. 31, 2010

(65) Prior Publication Data
US 2011/0184705 A1 Jul. 28, 2011

Related U.S. Application Data

(60) Provisional application No. 61/298,359, filed on Jan. 26, 2010.

(51) Int. Cl.
*G06F 17/50* (2006.01)
(52) U.S. Cl.
USPC .......................................................... 703/14
(58) Field of Classification Search
USPC ............ 703/2, 16, 22, 14; 706/58; 718/100; 707/5; 716/3, 4, 5; 717/126
See application file for complete search history.

(56) References Cited

U.S. PATENT DOCUMENTS

| | | | |
|---|---|---|---|
| 6,728,665 B1 * | 4/2004 | Gupta et al. ...................... | 703/2 |
| 2003/0225552 A1 * | 12/2003 | Ganai et al. ...................... | 703/2 |
| 2004/0019468 A1 * | 1/2004 | De Moura et al. ................ | 703/2 |
| 2004/0230407 A1 * | 11/2004 | Gupta et al. ...................... | 703/2 |
| 2005/0262456 A1 * | 11/2005 | Prasad .............................. | 716/4 |
| 2007/0011629 A1 * | 1/2007 | Shacham et al. .................. | 716/3 |
| 2007/0168988 A1 * | 7/2007 | Eisner et al. .................. | 717/126 |
| 2007/0226665 A1 * | 9/2007 | Ganai et al. ...................... | 716/5 |
| 2007/0299648 A1 * | 12/2007 | Levitt et al. ...................... | 703/22 |
| 2008/0103750 A1 * | 5/2008 | Khasidashvili et al. ......... | 703/16 |
| 2009/0024557 A1 * | 1/2009 | Fuhrmann et al. ............... | 706/58 |
| 2009/0089783 A1 * | 4/2009 | Wang et al. .................... | 718/100 |
| 2009/0125294 A1 * | 5/2009 | Ganai ............................. | 703/22 |
| 2009/0204968 A1 * | 8/2009 | Kahlon et al. ................. | 718/100 |
| 2009/0307204 A1 * | 12/2009 | Shacham et al. .................. | 707/5 |

OTHER PUBLICATIONS

Ganai et al., "Efficient SAT based unbounded symbolic model checking using circuit cofactoring", IEEE 2004.*
Hutter et al., "Boosting verification by automating tuning of decision procedures", IEEE 2007.*
Wang et al., "Refining SAT decision ordering for bounded model checking", DAC 2004.*
Shtrichman, "Tuning SAT checkers for bounded model checking", CAV 2000.*
Sheng et al., "Success driven learning in ATPG for preimage computation", IEEE 2004.*
Beame, P., et al. "Towards Understanding and Harnessing the Potential of Clause Learning" Journal of Artificial Intelligence Research (JAIR), vol. 22. Dec. 2004. pp. 319-330.

(Continued)

*Primary Examiner* — Kandasamy Thangavelu
(74) *Attorney, Agent, or Firm* — Joseph Kolodka; James Bitetto

(57) ABSTRACT

A system and method for determining satisfiability of a bounded model checking instance by restricting the decision variable ordering of the SAT solver to a sequence wherein a set of control state variables is given higher priority over the rest variables appearing in the formula. The order for control state variables is chosen based on an increasing order of the control path distance of corresponding control states from the target control state. The order of the control variables is fixed, while that of the rest is determined by the SAT search. Such a decision variable ordering strategy leads to improved performance of SAT solver by early detection and pruning of the infeasible path segments that are closer to target control state.

18 Claims, 4 Drawing Sheets

(56) References Cited

OTHER PUBLICATIONS

Giunchiglia, E., et al. "Dependent and Independent Variables in Propositional Satisfiability" Logics in Artificial Intelligence, European Conference, JELIA 2002. Sep. 2002. (12 Pages).

Ivancic, F., et al. "Efficient SAT-Based Bounded Model Checking for Software Verification" Theoretical Computer Science, vol. 404. Nos. 1-2. Sep. 2008. (15 Pages).

Kilby, P., et al. "Backbones and Backdoors in Satisfiability" Proceedings, The Twentieth National Conference on Artificial Intelligence and the Seventeenth Innovative Applications of Artificial Intelligence Conference. Jul. 2005. (6 Pages).

Williams, R., et al. "Backdoors to Typical Case Complexity" IJCAI-03, Proceedings of the Eighteenth International Joint Conference on Artificial Intelligence. Aug. 2003. (6 Pages).

* cited by examiner

DPLL-BASED SAT SOLVER USING WITH APPLICATION-AWARE BRANCHING

RELATED APPLICATION INFORMATION

This application claims priority to provisional application Ser. No. 61/298,359 filed on Jan. 26, 2010 incorporated herein by reference.

BACKGROUND

1. Technical Field

The present invention relates to model checking for software and hardware and more particularly to a system and method for more efficiently validating models using application-aware satisfiability checkers.

2. Description of the Related Art

In application domains such as model checking of software and hardware, an analysis engine has to explore paths of bounded length to validate a reachability property. The core of the analysis engine typically uses a Davis Putnam Longman Loveland (DPLL) based satisfiability (SAT) solver to search through the path formula. As the paths get longer, the number of possible paths increases exponentially. This leads to an increase in formula size, and the search space; thereby, affecting the performance of the analysis engine.

Current SAT solvers use various techniques such as frequent restarts, branching heuristics, and conflict-driven learning to prune the search space faster. Other techniques include learning clauses such as conflict-driven resolution clauses and binary clauses. These solvers also rely on other features such as two-literal watch scheme, table lookup, efficient preprocessing, hybrid representation, and many others. However, these techniques are based on heuristics that are derived from a given formula. These techniques may become inefficient due to excessive restarts and branching. Such approaches do not consider application specific information to guide the search.

SUMMARY

A system and method for determining satisfiability of a bounded model checking instance by restricting the decision variable ordering of the SAT solver to a sequence wherein a set of control state variables is given higher priority over the rest variables appearing in the formula. The order for control state variables is chosen based on an increasing order of the control path distance of corresponding control states from the target control state. The order of the control variables is fixed, while that of the rest is determined by the SAT search. Such a decision variable ordering strategy leads to improved performance of SAT solver by early detection and pruning of the infeasible path segments that are closer to target control state.

A method for determining satisfiability of a bounded model checking instance includes restricting a decision variable ordering of a satisfiability (SAT) search of a SAT solver, stored in computer readable storage media, to a sequence wherein a set of control state variables is given higher priority over other variables appearing in a formula; selecting an order for control state variables based on increasing control path distance of corresponding control states from a target control state, wherein other variables in the formula have an order that is determined by the SAT search performed by the solver; and detecting and pruning infeasible path segments closer to the target control state first based on the SAT search.

A system includes a processor and a memory coupled to the processor and configured to execute a program for determining satisfiability of bounded model checking instance to: determine reachability of a target control state from an initial control state through a finite set of bounded control paths by restricting decision variable ordering of a satisfiability (SAT) search performed by a SAT solver stored in computer readable storage media to a sequence of formula variables and selecting a set of control state variables with a higher decision priority than other formula variables in a decision path having a sequence of Boolean value assignments on unassigned variables.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
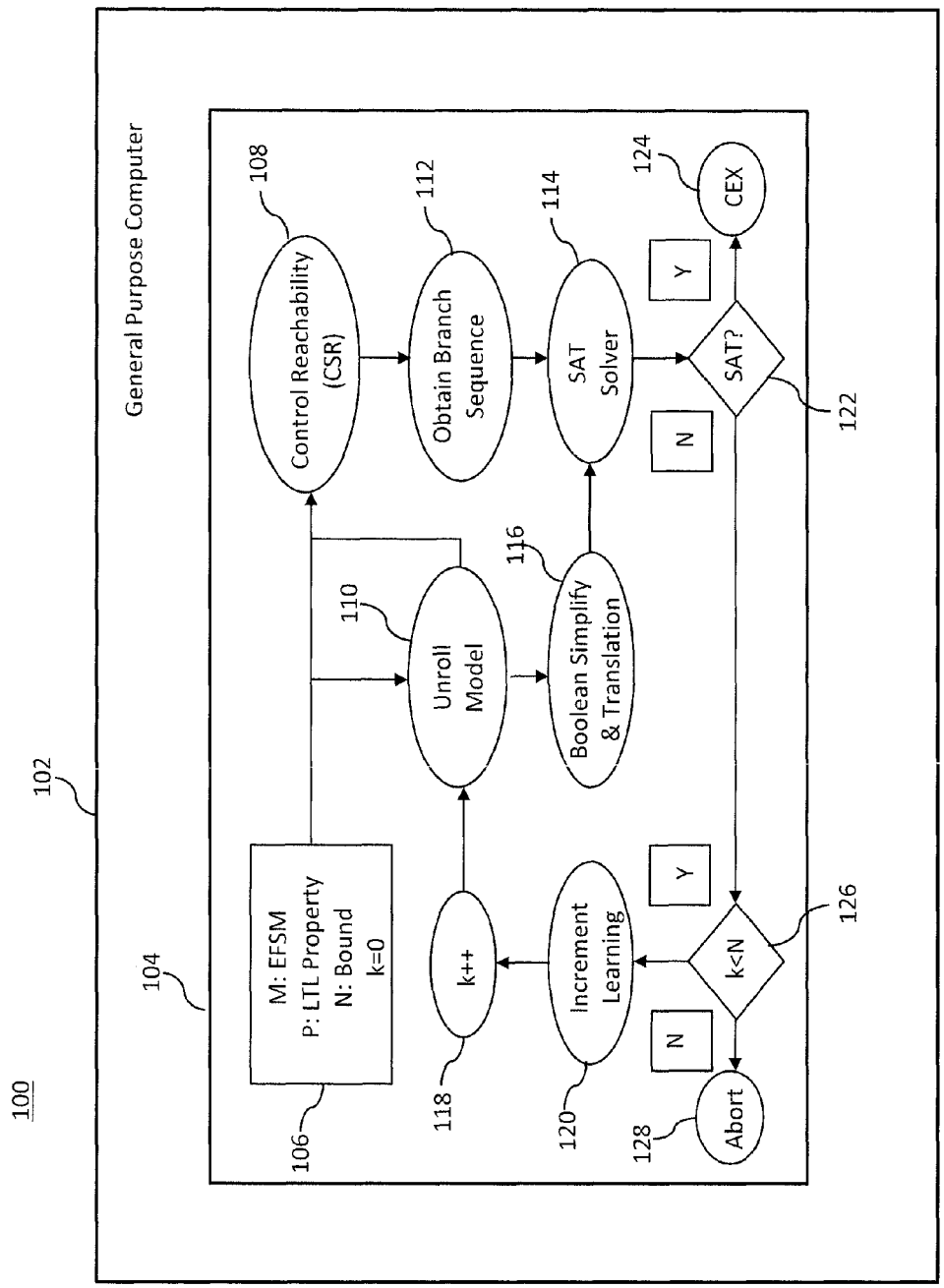
FIG. 1 is a block/flow diagram showing a system/method for satisfiability solving using with application-aware branching in accordance with the present principles.

In accordance with the present principles, systems and methods integrate application level information directly into a solver to improve overall performance of the solver. The present embodiments build an application-aware branching technique on top of a Davis Putnam Longman Loveland (DPLL) based satisfiability (SAT) solver. From each bounded model checking problem, control flow information is obtained for a corresponding unrolling control flow graph (CFG). Control state reachability (CSR) information is computed from the unrolled CFG. For the given target control state (reachability goal), a sequence of control states is obtained in an increasing order of its control path distance to reach the target control state. The solver is provided with such a branching sequence corresponding to the derived control state order.

During a decision phase, the SAT solver picks the first free variable from the sequence provided, and assigns a Boolean value TRUE. If all the variables in the provided sequence are assigned, the decision engine continues with the other remaining variables using a branching heuristic such as, variable state independent decaying sum (VSIDS) or other known method.

The present embodiments permit faster pruning of infeasible paths. The branching sequence ensures that the infeasible path segments which are closer to the target control state are detected early, which leads to faster resolution with fewer backtracks.

We have formalized the notion of care set variables in SAT problem instances. Such a notion provides a set of variables that must be assigned in a satisfiable instance. A branching technique is provided based on a branching prefix sequence (BPS), where a decision engine is guided by restricting the branching first on such care set variables in every search path. Though finding such a set may not be tractable in general, for software verification applications, we can derive the set automatically from application-specific knowledge such as sequential behavior of the software models. Such branching significantly reduces the search effort of a DPLL-based solver with a clause learning (i.e., Conflict-driven Clause learning (CDCL) solver by helping the solver learn useful clauses earlier during the search process. A CDCL solver restricted with BPS performs orders of magnitude better than well known branching heuristics. The power of such a restricted CDCL solver is demonstrated by showing an order of magnitude improvement over winners of the SAT 2009 competition. Also, a variation of the CDCL solver restricted with BPS can simulate an unrestrictive CDCL.

In bounded model checking (BMC), problem instances (or propositional decision problems) are derived from transition relation capturing the sequential behavior of the underlying system application using suitable transformation. These problem instances are encoded into equi-satisfiable simple Conjunctive Normal Form (CNF) format. However, in such encoding, the structure and behavior of the system gets "lost". By lost, we imply that the high level system information cannot be recovered without knowing the actual transformation process. The typical losses includes 1) Structure of the transition relation: During bit-blasting of the transition relation, there is a substantial loss of structural information such as types of arithmetic and logical modules, connectivity among such modules i.e., the dependency of the modules, and independent (or controlling variables). 2) System level behavior: During synthesis of a transition relation from a system, the underlying constraints and sequential behaviors may get muddled up.

Some success may come from exploiting structural information in the propositional formula to improve the DPLL-based solver learning (referred to as CDCL). However, these techniques do not account for higher level application specific information to guide the search. Our branching is based on sequential behavior of the models. The present embodiments are targeted to improve the performance (both time and memory) of DPLL-based SAT solvers, thereby, improving the performance of the SAT-based model checking tool. Due to improved pruning, the size of unsatisfiable proof is small, thereby, providing a smaller memory footprint as well.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now to the drawings in which like numerals represent the same or similar elements and initially to FIG. 1, an illustrative system 100 for implementing a solver in accordance with the present principles is shown. The system 100 may be implemented in software and stored in storage memory 102 on a computer 104. In block 106, given an extended finite state machine (EFSM) model M, a reachability property P (corresponding to a target control state), and a counterexample depth bound N, bounded model checking (BMC) searches for a counterexample 124 of length of at most N may be performed by generating a BMC instance at each depth (k), and checking its satisfiability using a SAT Solver 114. Specifically, the model M is first unrolled in block 110 for various k, i.e., $0<=k<N$. At depth k, the unrolled model 110 is simplified and translated into a Boolean formula in block 116. The translated formula (116) is given to the SAT solver 114. If the formula is satisfiable in block 122, the solver returns with SAT result and a counter-example (CEX) 124. Otherwise from block 122, if k is less than N as determined in block 126, k is incremented in block 118 with an optional incremental learning step in block 120. The search for a counterexample continues with higher k until it reaches N, when the entire search process aborts in block 128.

In accordance with a particularly useful embodiment, control state reachability (CSR) information is generated in block 108 additionally from the unrolled model 110 at depth k. From the CSR information 108, a sequence of control state variables are obtained corresponding to an increasing order of control path distances of control states from the target control state in block 112. The SAT solver 114 performs Boolean reasoning on the translated Boolean formula, using the provided branching sequence 112 as a prefix decision variable order. The SAT solver decision engine 114 branches on the variables other than the control variables only after all the control variables in the sequence are assigned Boolean values.

We can exploit the sequential behavior of the system to improve a CDCL solver. It has been shown formally that CDCL is exponentially stronger than DPLL. However, CDCL may not give the shortest solutions for any branching order. However, in accordance with one embodiment, the right variables and their order may be selected to permit CDCL usage. For circuit domain applications, it is a well-established fact that not all variables need to be assigned while determining a SAT result. Keeping that in mind, we formalized the notion of care set variables, a set of variables which must be assigned in any satisfying assignment. We provide a branching technique based on branching prefix sequence (BPS), where we guide the decision engine by restricting the branching first on some sequence of care set variables in every search path. If for some partial assignments of the care set variable leads to conflict, we backtrack as usual. However, if a total assignment to care set variable does not cause any conflict, we then branch on to the other free variables using default branching heuristics.

Though finding such a set and sequence may not be tractable in general, we demonstrate that for software verification applications, we can derive them automatically from application-specific knowledge such as sequential behavior of the software models. In such an application, we show that our approach produces dramatic performance improvement of the SAT solver.

A family of unsatisfiable formulas C provides an exponential separation between S and S', if the shortest proofs produced in system S are exponentially smaller than the corresponding shortest proofs in S'. If such a family exists, we say S cannot polynomially simulate S'. On the other hand, if for all infinite families of unsatisfiable formulas, there is a polynomial that bounds for all families of formula, the shortest proofs in S with respect to the length of the shortest proofs in S, we say S polynomially simulates S'. S and S' are polynomially equivalent if they can simulate each other.

We show that a variation of CDCL-based proof system using proposed restricted branching can polynomially simulate an unrestrictive CDCL, i.e., proofs obtained are polynomially as short as obtained using unrestrictive CDCL. Note unrestrictive CDCL trivially can simulate a restrictive CDCL. In other words, though a restrictive CDCL will show dramatic improvement in some applications, it cannot always perform exponentially worse than an unrestrictive CDCL in general. The present approaches were implemented in a circuit-based hybrid CDCL solver, where the problem is represented in And-Inverter circuit graph (AIG), and the learned clauses are represented in CNF. Such a dual representation permits the CDCL solver to exploit circuit structural information in the decision engine very efficiently (unlike the CNF solver where the information needs to be extracted and integrated separately in a two step process. Moreover, it uses justification frontier heuristics to skip branching on the variables (or gates) that do not affect the currently justified gates.

The present solver implements the known Chaff algorithm using 1UIP-based clause learning scheme, and variable state independent decaying sum (VSIDS)-based branching. This branching technique provides exponential speedup (a few orders of magnitude) for the software bounded model checking problems over well known branching heuristics. In addition, we have shown that our solver performs an order of magnitude better than the winners of SAT 2009 competition.

A CNF formula F is defined as a conjunctive set, i.e., AND ($\wedge$) of clauses where each clause is a disjunctive set, i.e., OR ($\vee$) of literals. A literal is a variable or its negation ($\neg$). Let V and C represent the set of all variables and clauses in F respectively. As assignment for F is a Boolean function $\alpha$: V' $\mapsto$ {T, F}, where V' $\subseteq$ V. If V'=V, we say $\alpha$ is a total assignment, otherwise, it is a partial assignment. A free variable is the one that is not assigned. $\alpha$ is a satisfying assignment if all clauses are satisfied, and not necessarily all variables be assigned. We stick to this definition, though most CNF solvers use the total satisfying assignment as a stopping criteria for efficiency reasons. We use $F^\alpha$ to denote the restricted formula where the corresponding assigned variables are replaced with their assigned values, and $F|_\alpha$ to denote a simplified formula where false literals and satisfied clauses are removed.

We say a satisfying assignment $\alpha$ is minimal if (i) $F|_\alpha$ can be shown to be satisfiable in a polynomial time algorithm, and (ii) unassigning at least one variable would violate the condition (i). We consider Boolean circuit G represented as AND-Inverter Graph (AIG) as DAG. A graph node represents a 2-input AND gate and an edge connects a gate to its fanout node. Additionally, each edge has an attribute denoting whether the edge represents an inversion, i.e., NOT gate. Note, all Boolean circuits can be efficiently represented in AIG using known preprocessing techniques. Let $G_D$, and $G_I$ represent the set of all gates and primary inputs of G. We define an assignment for G as Boolean function $\alpha$: W $\mapsto$ {T, F}, where W $\subseteq$ $G_D \cup G_I$.

We say a gate is justified, when its input values justify its output value. For example, for g=AND (a, b), g=0 can be justified by either a=0 or b=0. We say a=0 or b=0 as its justifying input respectfully. We say a gate is totally justified, if its justifying inputs are also totally justified. Note, a primary input is always justified. A constraint Boolean circuit is pair $\langle G, \tau \rangle$ where some gates in Boolean Circuit G are constrained with an assignment T. We say $\langle G, \tau \rangle$ is satisfiable if there exists some assignment that: (i) preserves the input/output relation of each gate, and (ii) each constraint gate is totally justified. Note, without a constraint, a Boolean circuit is always satisfiable. Since $G_I \ll G_D$, many solvers use input-restricted branching to take advantage of smaller search space.

We say a satisfying assignment for $\langle G, \tau \rangle$ is minimal if un-assigning any unconstraint gate would leave some constraint gate not totally justified. One can also translate a constraint Boolean circuit $\langle G, \tau \rangle$ into an equi-satisfiable CNF formula cnf $\langle G, \tau \rangle$. Similarly, one can translate a CNF formula into an equisatisfiable circuit formula, denoted as ckt (F). Note that both these translations can be done polynomially.

Definition 1 (backbone). A set of variables S is a backbone of F if there is a unique partial assignment $\alpha$: S $\mapsto$ {T, F}, such that, $F|_\alpha$ is satisfiable. In other words, assigning opposite value to a backbone variable would make $F|_\alpha$ unsatisfiable.

Definition 2 (backdoor). A non-empty set of variables S is a backdoor in a satisfiable F if for some assignment $\alpha$: S $\mapsto$ {T, F}, $F|_\alpha$ can be shown satisfiable in polynomial time.

DPLL: A DPLL procedure has three basic elements: 1) branch on a literal, 2) apply a unit propagation (UP) rule, and 3) backtrack chronologically when conflict is observed. UP rule is applied when all literals but one of a clause is assigned F, and the only literal is unassigned. In that case, as per UP rule, the unassigned literal is assigned T. Branching is carried out until all clauses are satisfied or an initial clause is violated when a satisfiable and unsatisfiable result is returned, respectively. During conflict, backtrack is done to the last branching decision whose other branch has not been tried yet, and the process continues. Sometimes, we also refer to successive applications of UP as Boolean Constraint Propagation (BCP). A branching sequence can be provided to such a DPLL solver to guide the search.

Definition 3 (branching sequence). A branching sequence for F is a sequence $\sigma = (l_1 \ldots l_m)$ of literals of F, possibly with repetitions such that a DPLL based algorithm branches according to $\sigma$, i.e., picks the first free literal (skipping the assigned literals) and branches on the literal with a chosen value and removes it from $\sigma$. When $\Gamma$ is empty, a default branching heuristic is used.

Resolution and CDCL: Given clauses (A $\vee$ y) and (B $\vee$ $\neg$y), where A, B are disjunctive sets of literals and y is a literal. Applying a resolution rule, we obtain a clause (A $\vee$ B). Conflict-driven Clause learning (CDCL) is an improvement over the basic DPLL procedure. When there is a conflict, it identifies the causes of the conflict, applies resolution rules to derive a non-redundant clause, adds the clause, and backtracks non-chronologically. It then continues like ordinary DPLL, treating the learned clause just like initial clauses. Learning such additional clauses prevents revisiting the same conflict, thereby, reducing the search effort.

Careset: We first give a formal definition of careset variables that is applicable for satisfiable Boolean formula F.

Definition 4 (careset). A non-empty subset S of variables is a careset in a given formula F, if for every minimal satisfying assignment α of F, the variables in S must be assigned.

Intuitively, careset is a minimum set that needs to be assigned to witness a satisfying assignment. Using the following proposition, the definition of careset variables can be easily extended to Boolean constraint circuit $\langle G, \tau \rangle$.

Proposition 1. If α is the minimal satisfying assignment of $\langle G, \tau \rangle$, then it is also a minimal satisfying assignment for F=cnf($\langle G, \tau \rangle$).

As α is minimal satisfying assignment for $\langle G, \tau \rangle$, all and only constraints gates are totally justified. We first show that F|$_\alpha$ can be shown satisfiable in polynomial time. Note that F|$_\alpha$ is a set of gate clauses of unconstrained gates in G. Also, by the property of Boolean circuit, any unconstrained gates can be trivially satisfied by propagating any arbitrary assignment on the unassigned primary inputs f G. Similarly, for F|$_\alpha$ we branch on unassigned primary input variables with any decision value and apply UP. Clearly, unassigning any variable in a given α would make a not minimally satisfying assignment for $\langle G, \tau \rangle$ either. Thus, it is also minimally satisfying assignment for F.

Comparing Careset, Backdoor, Backbone: In contrast to backbone variables which are necessarily set to a certain value, careset variables is a set that necessarily have some assigned values in any satisfying assignments. Compared to backdoor which is a sufficient set, a careset is a necessary set for solving a satisfiable problem. Note, even after a complete assignment of careset variables, we may not be able to reduce the problem that can then be solved just by the unit propagation rule.

If a number of careset variables S is small, then we would need to search over a small space $2^{|S|}$ to guarantee a satisfying solution, if one exists. One should branch on careset variables first, before branching on other variables. Once careset variables are fully assigned, we can hope for a satisfiable solution. If the problem is unsatisfiable, it is likely that we get conflict before all such variables are assigned. Empirical evidence indeed supports this. We would like to answer the following questions regarding careset:

How do we obtain careset variables, and what are their size?

How can careset variables be exploited in solving a real-world application?

How does restrictive branching affect the proof complexity of the solver in general?

These questions can be answered by considering a software model checking application. We present a restrictive CDCL method using the careset variables, and demonstrate its strength in solving hard BMC instances vis-à-vis state of-the-art CDCL solvers. Then, we compare the complexity of such solver to an unrestrictive CDCL solver.

Application: Model Checking of Software. With reference to FIG. 1, a model M may be built from a given C program under the assumption of a bounded heap and a bounded stack. We obtain a simplified CFG by flattening the structures and arrays into scalar variables of simple types (Boolean, integer). We handle pointer accesses using direct memory access on a finite heap model, and apply standard slicing and constant propagation. We do not inline non-recursive procedures to avoid blow up, but bound and inline recursive procedures up to some user-defined depth. From the simplified CFG, we build an EFSM where each block is identified with a unique id, and a control state variable PC denoting the current block id. We construct a symbolic transition relation for PC, that represents the guarded transitions between the basic blocks. For each data variable, we add an update transition relation based on the expressions assigned to the variable in various basic blocks in the CFG. We use Boolean expressions to represent the update and guarded transition functions. The common design errors are modeled as ERROR blocks.

We define a Boolean predicate $B_r \equiv (PC=r)$, where PC is the program counter that tracks the current control state. In the sequel, we use $\upsilon^d$ to denote the unrolled variable $\upsilon$ at depth d during BMC unrolling (110). We consider the reachability of an ERROR block Err from a SOURCE block Src.

Modeling C programs as EFSM: An Extended Finite State Machine (EFSM) model M is preferably a 5-tuple ($s_0$, C, I, D, T) where $s_0$ is an initial state, C is a set of control states (or blocks), I is a set of inputs, D is an n dimensional space $D_1$ x ... x $D_n$ of valuations of n datapath variables, and T is a set of 4-tuple (c, x, c', x') transitions where c, c'∈C, and x, x'∈D. An ordered pair <c, x>∈C×D is called a state of M Let g: D×I ↦ B={0,1} denote a Boolean-valued enabling condition (or guard), and u: D×I↦ D denote an update function. A transition from a state <c, x> to <c', x'> under enabling predicate g(x, i), and update relation u(x, i, x') is represented as $$\langle c, x \rangle \xrightarrow[u]{g} \langle c', x' \rangle.$$

Let Γ: C×C↦ {0, 1} denote a Boolean predicate such that for c, c'∈C, Γ(c, c')=1 if and only if there is an enabling condition associated with the control transition from c to c'. A SOURCE (SINK) state is a unique control state with no incoming (outgoing) transition.

A control flow graph (CFG) G=(V, E, r) consists of a set of nodes V corresponding to control states, a set of directed control flow edges E, and an entry node r. A CFG is obtained from an EFSM 10.1 by ignoring the enabling and updated transitions, i.e., we obtain a CFG from EFSM 10.1 with V=C, E={(c,c')|Γ(c,c')=1}, and r=SOURCE.

Figures 2A, 2B, 2C:
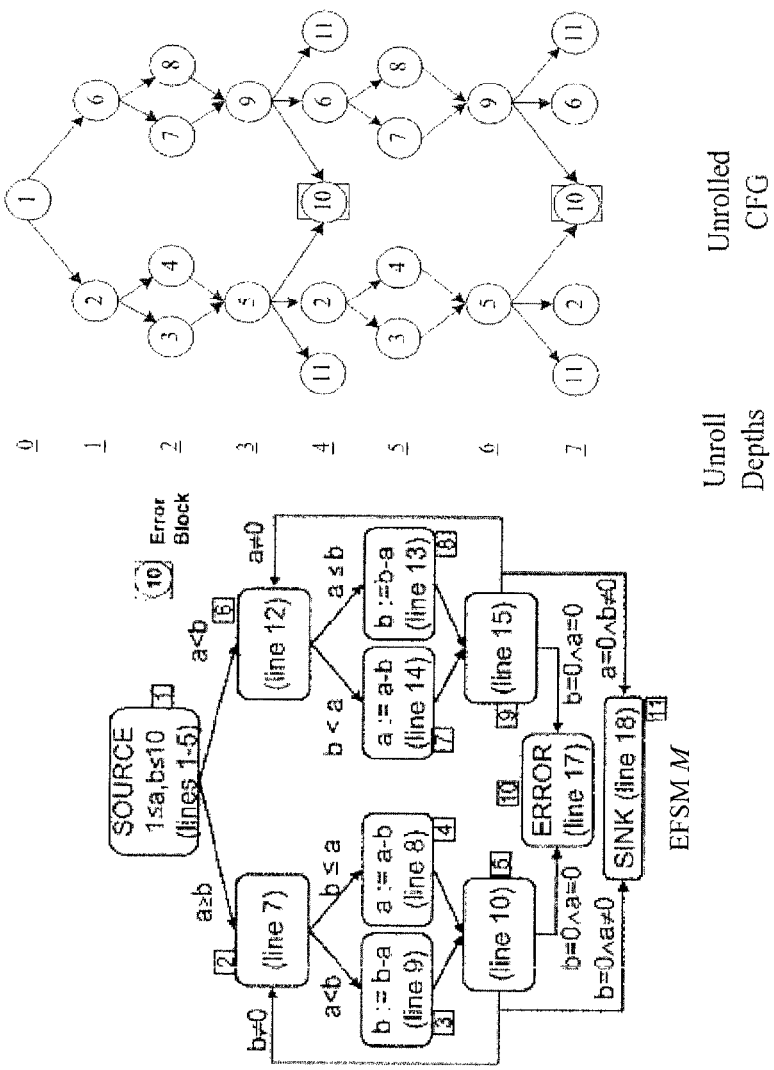
FIG. 2A is an example C program.
FIG. 2B is an extended finite state model diagram of the program of FIG. 2A.
FIG. 2C is an unrolled control flow graph (CFG) for the extended finite state model diagram of FIG. 2B and program of FIG. 2A.

Referring to FIG. 2, consider a low-level C program foo as shown in FIG. 2A, with its EFSM M shown in FIG. 2B. Control states, shown as boxes 1-10, correspond to control points in the program, as also indicated by the line numbers from FIG. 2A. Note, each control state is identified with a number in the attached small square box. For example, ERROR block 10 corresponds to the assertion in line 17. Update transitions of data path expressions are shown at each control state. A transition edge between control states in the EFSM corresponds to control flow between the associated control points in the program. Each such edge is associated with an enabling predicate. FIG. 2C is an unrolled CFG for depth 7 corresponding to the sample C code (FIG. 2A and EFSM of FIG. 2B.

Symbolic Reachability Analysis: Let $s_i \equiv <c_i, x_i>$ denote a state, and T ($s_i, s_{i+1}$) denote the state transition relation. A path is a sequence of successive states, denoted as $\pi^{0,k}=(S_0, \ldots, S_k)$, satisfying the predicate:

$$T^{0,k} \stackrel{def}{=} \bigwedge_{0 \leq i < k} T(s_i + s_{i+1}) \quad (1)$$

with $T^{0,0}=1$. A path has length k if it makes k transitions.

A BMC instance comprises checking if an LTL (Linear Temporal Logic) property $\phi$ can be falsified in exactly k steps from the initial state $s_0$ of the following formula:

$$BMC^k \stackrel{def}{=} T^{0,k} \wedge \neg \phi(s_k) \quad (2)$$

where $\phi(s_k)$ denotes the predicate that $\phi$ holds in state $s_k$. Given a bound n, BMC iteratively checks the satisfiability of $BMC^k$ for $0 \leq k \leq n$ using an SMT/SAT solver. When considering the reachability of block Err from block Src, we define $\phi:=F(C=Err)$, where F is the eventually LTL operator.

Control State Reachability: A control path is a sequence of successive control states, denoted as $\gamma^{0,k}=(c_0, \ldots, c_k)$, satisfying the predicate:

$$\Gamma^{0,k} \stackrel{def}{=} \bigwedge_{0 \leq i < k} \Gamma(c_i + c_{i+1}) \quad (3)$$

with $\Gamma^{0,0}=1$. A control state reachability (CSR) analysis (block 108 of FIG. 1) is a breadth-first traversal of the CFG where a control state b is one step reachable from a iff $\Gamma(a,b)=1$. If the one step reachability is in the forward (backward) direction, we refer it as forward (backward) CSR. At a given sequential depth d, let R(d) represent the set of control states that can be reached statically, i.e., ignoring the guards, in one step from the states in R(d-1), with $R(0)=c_0$.

Computing (forward) CSR for the CFG of M (FIG. 2B), we obtain the set R(d) for $0 \leq d \leq 7$ (FIG. 2C): R(0)={1}, R(1)={2,6}, R(2)={3,4,7,8}, R(3)={5,9}, R(4)={2,10,6,11}, R(5)={3,4,7,8}, R(6)={5,9}, R(7)={2, 10,6, 11}.

Generating Careset for Software model checking: The following theorem will provide the basis for generating careset variables for software models as discussed in the previous section.

Theorem 1.

The variables corresponding to the control states that are in the control paths from Src to Err block are careset variables in $BMC^k$. (see FIG. 2B). Each control path $\gamma^{0,k}=(c_0, \ldots, c_k)$ in unrolled CFG, is a sequence of control states. Clearly, for $BMC^k$ to be satisfiable, there exists some control path $\gamma^{0,k}$ that witnesses the reachability of the Err control state $c_k=Err$.

Note, all control paths reaching Err control state may not be a witness path. By virtue of modeling, PC can take only one control state value at any given depth. Recall, $B^d_r$ refers to a Boolean variable corresponding to control state r at depth d. Thus, $B^d_r=1$ would imply that $B^d_s=0$ for $\ldots,s\chi R(d)$ and r does not equal s. Thus, a witness control path necessarily disables other control paths. Since control state variables at each depth must be assigned to witness a satisfying assignment, such variables are indeed careset variables.

In the following, we provide a simple procedure to obtain such set. For $BMC^k$, we obtain careset, denoted care($BMC^k$), as follows:
1. Compute forward CSR starting from R(0)={Src}
2. Remove a control state c from R(d), i.e., R(d)←R(d)\c if there is no path from c to the Err control state by computing a backward slice.
3. Continue step 2 until no such control state exists.
4. care($BMC^k$):={$B^d_r$, r∈R(d), $0 \leq d \leq k$}.

For the example shown in FIG. 2, the careset set in $BMC^4$ is {$B^0_1, B^1_2, B^2_3, B^2_4, B^3_5, B^1_6, B^2_7, B^2_8, B^3_9, B^4_{10}$}. We now introduce the notion of control distance of a careset variable $B^d_r \in$ care ($BMC^k$).

Definition 5. A control distance of a careset variable $B^d_r \in$ care ($BMC^k$) is a function $\delta$: care($BMC^k$) $\mapsto \{0, \ldots, k\}$ such that $\delta(B^d_r)=k-d$. For example, $B^1_6 \in$ care ($BMC^4$) has a control distance $\delta(B^2_6)=4-1=3$.

Branching Prefix Sequence: We introduce the notion of branching prefix sequence, a kind of restrictive branching where the branching variable and its value are available to the CDCL solver before any branching occurs. Such a branching sequence (block 112 of FIG. 1) captures the application specific knowledge, and thereby, guides the decision engine to show a satisfiable/unsatisfiable result by quickly learning useful clauses.

Definition 6. A branching prefix sequence (BPS) for a formula F is an ordered sequence $\sigma=(l_1 \ldots l_m)$ of literals of F such that a CDCL-based algorithm always picks a first free literal in $\sigma$ (skipping the assigned literals), and branches on a literal with the chosen value. If all the literals in $\sigma$ are assigned, a default branching heuristic is applied. The branching literal of $\sigma$ is never removed. During backtracking, some of the literals in $\sigma$ can become free. At any decision level, the method always branches on a first free literal in G. A CDCL provided with such a branching prefix sequence is referred to as $CDCL_{bps}$. In other words, every decision path is always prefixed by some literals from the branching prefix sequence, if not all assigned at decision level 0.

In contrast to the branching sequence (of Definition 3) where a branching literal in a sequence is removed, BPS does not remove any literal. One can implement $CDCL_{bps}$ in a CDCL by simply giving an extremely large preference score to the variables in BPS. This will force CDCL to branch on these variables before the rest.

Definition 7. An increasing (decreasing) sequence of variables in care ($BMC_k$) is defined as a total order on the careset variables with respect to non-decreasing (non-increasing) control distances. Variables with same control distances can be chosen arbitrarily. We use IS (care($BMC_k$)) (SS(care(B-$MC^k$))) to denote increasing (decreasing) sequence of care ($BMC_k$). An increasing sequence IS(care($BMC^4$)), for example, is {$B^4_{10}(0), B^3_5(1), B^3_9(1), B^2_3(2), B^2_4(2), B^2_7(2), B^2_8(2), B^1_2(3), B^1_6(3), B^0_1(4)$}. Values in the parentheses refer to the respective control distances of the variables. Intuitively, using IS(care($BMC^k$) as a branching prefix sequence would help a CDCL solver prune the infeasible local path segments that are closer to the target error block by learning useful clauses quickly. This would help both satisfiable and unsatisfiable instances equally. We show the internal of $CDCL_{bps}$ on the problem $BMC_4$ using the sequence IS(care ($BMC_4$)) for a first few decision levels (DL). We show the reason for assigning a value in parentheses.

DL=0 $B^4_{10}=1$ (Constraint).
DL=1 $B^3_5=1$ (Branch); $B^3_9=0$, $b^3=0$, $a^3=0$ (CP).
DL=2 $B^2_3=1$ (Branch); $B^2_4=0$, $B^1_8=0$, $a^2=a^1=0$, $b_1=b^2=0$
 (CP); $B^1_2=1$ (Flow constraints); Conflict between ($a^1<b^1$) and a $1=b^1=0$; Backtrack to level 1.
DL=1 $B^1_4=1$ (Implied by learnt clause); $B^2_3=0$, $B^2_7=0$, $B^2_8=0$, $a^2=a^2=a^1=0$, $b^1=b^2=0$
 (CP); $B^0_1=1$ (Flow constraint); $a^0=b^0=0$; Conflict between ($1 \leq a^0$) and $a^0=0$; Backtrack to level 0;
DL=0 $B^1_9=0$, (Implied by learned clause) . . . .

We use flow constraints in $BMC^k$. Note, $a^d$, $b^d$ refer to unrolled variables a, b at depth d. For space constraints, we did not show their bit-blasted representation. However, the example illustrates that using the branching prefix sequence IS(care(BMC$^4$)), we can quickly eliminate the control path segments that do not reach the target error block. On the other hand, branching on the individual bits of data path variables a, b would prolong the search by learning useless clauses.

Experiments: We experimented with 8 sets of real world benchmarks E1-E8. These correspond to software models and properties generated from real-world 'C' programs such as network protocol with null pointer de-references checks and mobile with array bound violation checks. We used the software verification platform F-Soft to obtain these models. On these models, we apply a SAT-based bounded model checking engine.

We used a circuit-based hybrid SAT solver, where the problem is represented in And-Inverter circuit graph (AIG), and the learned clauses are represented in CNF. The experiments implement the Chaff algorithm using a 1UIP clause learning scheme, and variable state independent decaying sum (VSIDS) for branching. Note, this solver does not include all improvements of 2009 such as preprocessing (SATeLite), learning binary clauses during BCP, and smart frequent restarts. We refer to this solver as our basic CDCL with VSIDS heuristic.

Moreover, the solver optionally uses justification frontier heuristics to skip branching on the variables (or gates) that do not affect the currently justified gates. Branching is restricted to the inputs of currently unjustified gates. We refer to this branching heuristic as CKT. Optionally, we also provide our CDCL solver with a branching prefix sequence. For each BMC$^k$ instance, we automatically generate sequences IS(care (BMC$^k$)) and DS(care(BMC$^k$)). We use iBPS (dBPS) to denote the branching heuristic using IS (care(BMC$^k$)) (DS (care(BMC$^k$))). We consider following four combinations B1-B4 of the above heuristics, and studied their effects on our basic CDCL solver.

BI: VSIDS Our basic CDCL solver using VSIDS.
B2: VSIDS+CKT Branching is based on CKT. However, when there are many choices at a given decision level, we break the tie using VSIDS heuristics.
B3:VSIDS+CKT+iBPS Branching occurs as per the branching prefix sequence provided IS(care(BMC$^k$)). When there is no free variable in the given sequence, branching occurs as per VSIDS+CKT
B4:VSIDS+CKT+dBPS Similar to VSIDS+CKT+iBPS but with branching prefix sequence DS(care(BMC$^k$)).

Our experiments were conducted on a single threaded environment on a workstation with Intel Pentium II 3.4 GHz, 2 GB of RAM running Linux.

Experiment Set I.

In the first set of experiment, we show the performance of CDCL solver with branching heuristics B1-B4 on benchmarks E1-E8 in solving each BMC instance BMC$^k$ for k>0. These benchmarks have properties in the range from 1 to 3. Other than the branching heuristics, all other setup parameters were kept identical. We gave a timeout of 1200s for each BMC run. Heuristic B3 gives several orders of magnitude improvement over remaining heuristics. The heuristic B4 on the other hand, performs noticeably better than VSIDS in 3 cases, i.e., E3, E7, E9. This shows that branching order is important in a CDCL solver. Improvement using B2 over B1 was about the same. Using the B3 heuristic, CDCL was able to find 2 witnesses (at depths 43 and 63, respectively) in E7 which CDCL could not find using either B1 or B2. Heuristic B4, however, helped find the shorter witness (i.e., at depth 43).

Experiment Set II.

In the second set of experiments, we obtained DIMACS CNF format from the BMC instances at different depths from our earlier experiment. To keep our focus on hard problems, we only consider problems that take at least 5 seconds to solve by our solver. There are in total 130 SAT problems; out of which 128 are unsatisfiable instances and 2 are satisfiable instances. The number of variables in these benchmarks ranged from 120K to 2.2M, and the number of clauses ranged from 350K to 6.6M.

In this experiment we used the following heuristic VSIDS+ iBPS in our basic solver, which we refer to as NECLA SAT. We compared our solver with PrecoSAT, miniSAT, and glucose, the winners of SAT 2009 competition in the application category. The solver PrecoSAT was ranked first (i.e., both SAT+UNSAT), followed by miniSAT. The solver glucose was ranked fourth overall, but was ranked second in the UNSAT sub-category, while the solver miniSAT was ranked first in SAT category. These solvers are equipped with latest and greatest techniques in preprocessing (SATeLite), functional substitution of XOR/ITE gates, learning binary clauses during BCP, and smart frequent restarts. In contrast, our solver NECLA solver was equipped with only the new branching heuristic i.e, iBPS.

TABLE 1

Comparing NECLA Solver with SAT2009 Winners

| Solver | Cases Solved | SAT time(s) | UNSAT time (s) | Total Time (s) |
|---|---|---|---|---|
| NECLA | 130 | 24 | 2,042 | 2,066 |
| PrecoSAT | 130 | 468 | 18,367 | 18,835 |
| Glucose | 112 | NA (1 solved) | NA (111 solved) | 40,074 1,789 (NECLA on 112 cases) 17,381 (PrecoSAT on 112 solved cases) |
| miniSAT | 92 | NA (1 solved) | NA (91 solved) | 19,847 1,601 (NECLA on 92 cases) 12,131 (PrecoSAT on 92 cases) |

We provide a summary of the results in Table 1. In Column 1, we list the solvers we compared. In Column 2, we compare number of cases solved by each solver. In Columns 3 and 4, we present the solve time for SAT and UNSAT cases if all cases are solved, respectively. In Column 5 we present the total time taken. Clearly, the NECLA solver in accordance with the present principles performs about an order of magnitude improvement over the rest, including the best solver, i.e., PrecoSAT. Moreover, PrecoSAT is the only other solver than could solve all 130 cases. Other solvers glucose and miniSAT could only solve 1 out of 2 SAT cases. On 112 cases solved by glucose and 92 cases by miniSAT, NECLA SAT clearly out performed each by an order of magnitude.

We also compared NECLA and PrecoSAT solvers. Comparing the cases solved, and the cumulative time (in sec) of the respective solvers, we observed that there was an exponential separation between the cumulative times of the two solvers (with NECLA being superior). Further, we see a consistent performance improvement in NECLA solver.

$CDCL_{bps}$: for $CDCL_{bp}$, we use the notion of proof complexity to compare the relative power of proof inference systems in terms of the size of shortest proofs they can produce. We say a family of unsatisfiable formulas C provides an exponential separation between S and S'', if the shortest proofs produced in system S is exponentially smaller than the corresponding shortest proofs in S". If such a family exists, we say S cannot polynomially simulate S". On other hand, if for all infinite families of unsatisfiable formulas, there is a polynomial that bounds for all families of formula the shortest proofs in S with respect to the length of the shortest proofs in S, we say S polynomially simulates S". S and S" are polynomially equivalent if they can simulate each other.

Resolution proof system (RES) is based on the resolution rule. For a CDCL based proof system S and an unsatisfiable formula F, the complexity of F in S is the length of the shortest refutation (or proof) of F. CDCL proof system under any learning scheme is the CDCL search tree under that learning scheme. The length of the proof is the number of branching decisions. The proof system CDCL consists of CDCL proofs under any learning scheme. Not only CDCL has been found to be practically very useful, but its proof system was also shown exponentially better formally than classic DPLL (even with intelligent branching sequence), as stated in the following.

Theorem 2.

DPLL cannot polynomially simulate CDCL. Most modern solvers use restarts whenever the search process does not progress. During restart, the algorithm starts from decision level 0. All the variables are unassigned. The clauses learned thus far are treated as an initial clause. CDCL has been defined to denote a variation of the CDCL algorithm where one is allowed to branch on a variable even if it is assigned explicitly or during BCP. One can show that the CDCL-proof system is trivially stronger than the CDCL proof system.

The CDCL-proof system and RES are compared in the following theorem:

Theorem 3.

RES and CDCL- are polynomially equivalent. Like CDCL-, we define CDCL-$_\psi$ for a given BPS$\psi$ to denote a variation of CDCL$_\psi$ where one is allowed to branch on a variable even if it is assigned explicitly or during BCP. One can show that CDCL-$_\psi$ is trivially stronger than the CDCL$_\psi$ proof system.

Proposition 2.

For any formula F, an unrestrictive CDCL (F) can trivially simulate CDCL$_\psi$ (F) where w is the branching prefix sequence.

Theorem 4.

For any formula F, CDCL-$_\psi$ (F) with unlimited restarts and a branching prefix sequence $\psi$, can simulate unrestrictive CDCL(F).

Branching plays a role in a DPLL-based SAT solver. We have introduced the notion of careset variables i.e., the variables that necessarily are assigned in making a problem satisfiable. We guide the decision engine by restricting branching first on such careset variables. In general, obtaining such a set may be intractable without application-specific knowledge. For application domains such as SAT-based software bounded model checking (BMC), we derive such a set automatically from the sequential behavior of software models. Specifically, we derive a branching sequence from control flow information present in unrolled CFG that helps the solver prune the infeasible paths in BMC instances quickly by learning useful clauses earlier in the search. Using this technique, our SAT solver achieves a performance improvement of a few orders of magnitude over well known branching techniques.

We also show that such restrictive branching in CDCL (e.g., DPLL with clause learning (block 120 of FIG. 1) can produce optimal proofs as short as unrestrictive CDCL, i.e., careset restricted CDCL simulates unrestrictive CDCL. Thus, the restrictive CDCL show dramatic improvement in some applications, it will not perform exponentially worse than unrestrictive CDCL in general. We implemented these concepts in a circuit-based hybrid SAT solver. Interestingly, even without any of clause learning, preprocessing, or smart restarts implemented in our solver, the present solver still achieves an order of magnitude performance improvement over the winners of 2009 SAT Competition using the new branching technique.

Figure 3:
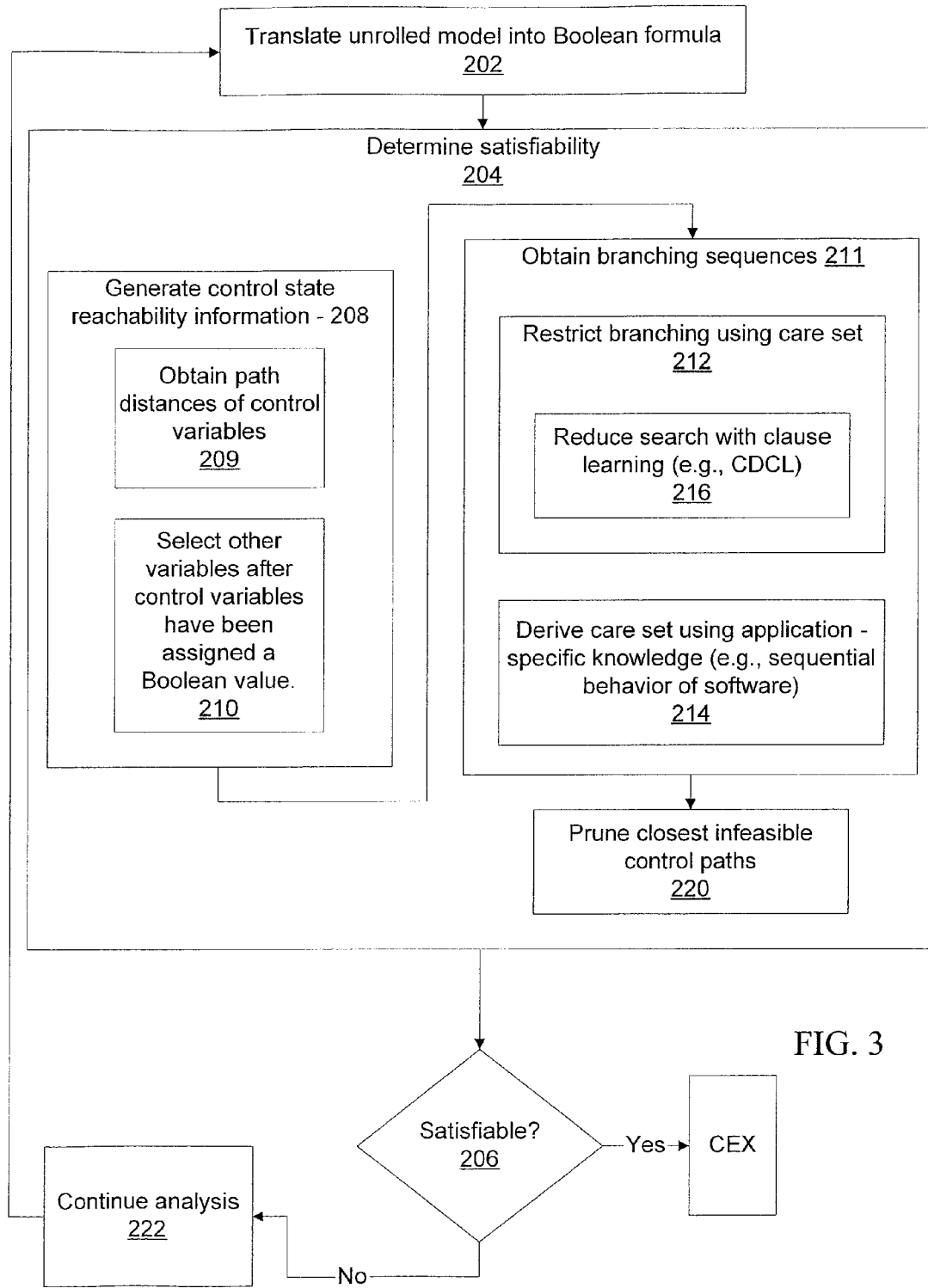
FIG. 3 is a block/flow diagram showing a system/method for analyzing a bounded model in accordance with another embodiment.

Referring to FIG. 3, a system/method for analyzing program code is shown in accordance with the present principles. In block 202, for an unrolled model of depth k, the model is translated into a Boolean formula. In block 204, satisfiability of the Boolean formula is determined using a satisfiability solver implemented in computer readable storage media. Block 204 will be described in greater detail below. In block 206, if the formula is not satisfiable, a depth of the unrolled model is incremented through block 222, and the analysis process continues until it completes or is aborted. If the formula is satisfiable, a counter example is generated.

The satifiability check in block 204 includes the following. In block 208, control state reachability (CSR) information is generated from the unrolled model to obtain a sequence of path distances of control state variables relative to a target control state in block 209. The sequence preferably includes a prefix sequence corresponding to the control variables appearing in the formula. Variables other than the control variables are selected after all control variables have been assigned a Boolean value in block 210.

In block 211, branching sequences are obtained. In block 212, branching is restricted based on a care set of variables that must be assigned in a satisfiable instance. In block 214, the care set of variables is derived automatically from application-specific knowledge. The application-specific knowledge may include sequential behavior of a software model. In block 216, restricting branching includes reducing a search process of a satisfiability solver with clause learning by helping the solver learn useful clauses earlier during the search process. The clause learning may be performed by a Conflict-driven Clause learning (CDCL) solver. In block 220, infeasible control paths closest to the target control state are pruned first to improve performance.

Figure 4:
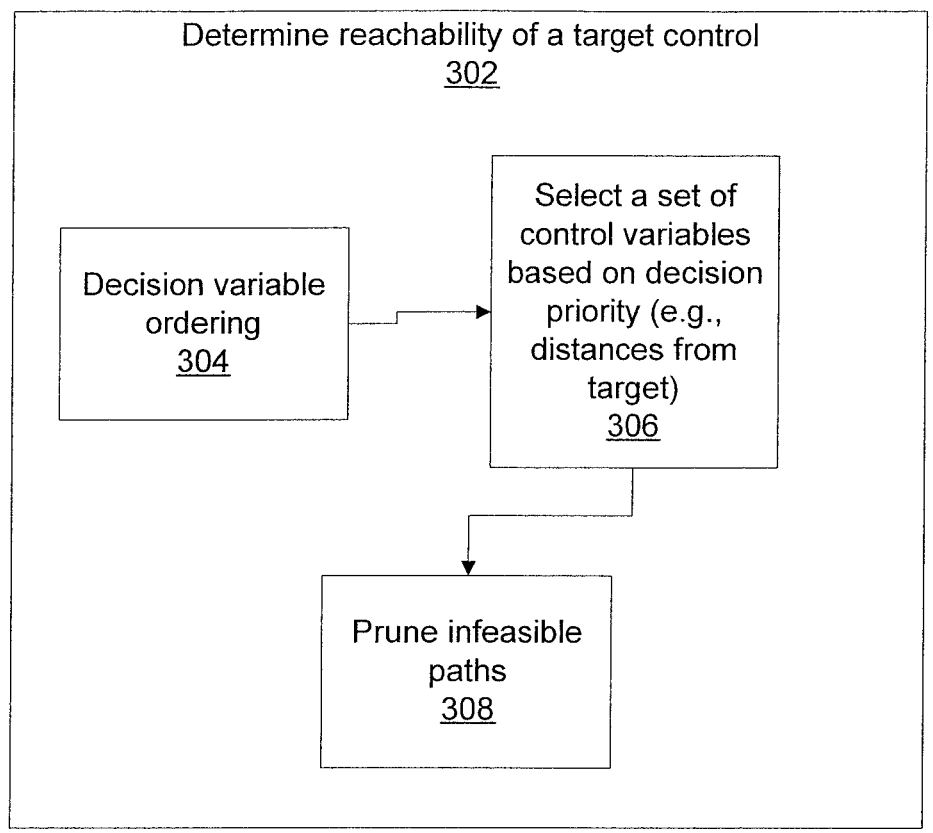
FIG. 4 is a block/flow diagram showing a system/method for analyzing a bounded model in accordance with yet another embodiment.

Referring to FIG. 4, a system/method for determining satisfiability of bounded model checking instance is shown in accordance with another embodiment. In block 302, reachability of a target control state is determined from an initial control state through a finite set of bounded control paths. In block 304, decision variable ordering of a Satisfiability (SAT) Solver is restricted to a sequence of formula variables. In block 306, a set of control state variables are selected with a higher decision priority than other formula variables (e.g., decision variables) in a decision path having a sequence of Boolean value assignments on unassigned variables. The control state variables are preferably selected in increasing order of a corresponding control state distance from the target control state. The decision order of control state variables is kept fixed until a SAT search is complete. A next variable in the order is selected when a current variable is assigned. In block 308, pruning infeasible control paths closest to the target control state first is performed.

Having described preferred embodiments of a system and method for a DPLL-based SAT solver using with application-aware branching (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for determining satisfiability of a bounded model checking instance, comprising:
  determining reachability of a target control state from an initial control state through a finite set of bounded control paths by:
    restricting, using a computer processor, decision variable ordering of a satisfiability (SAT) search of a SAT solver stored in computer readable storage media to a sequence of formula variables; and
    selecting, using the computer processor, a set of control state variables with a higher decision priority than other formula variables in one or more decision paths, each decision path comprising a sequence of Boolean value assignments on unassigned variables.

2. The method as recited in claim 1, wherein the control state variables are selected in increasing order of a corresponding control state distance from the target control state.

3. The method as recited in claim 2, wherein a decision order of control state variables in one or more decision paths is kept fixed until the SAT search is complete.

4. The method as recited in claim 1, wherein an unassigned variable next in an order is selected.

5. The method as recited in claim 1, wherein selecting the set of control state variables enables detecting and pruning infeasible control path segments closest to the target control state.

6. The method as recited in claim 1, wherein the formula variables other than the control state variables are selected in an order imposed by the SAT search when all control state variables are assigned.

7. A computer readable storage medium comprising a computer readable program, wherein the computer readable program when executed on a computer causes the computer to perform the steps of claim 1.

8. A method for determining satisfiability of a bounded model checking instance, comprising:
  restricting, using a computer processor, a decision variable ordering of a satisfiability (SAT) search of a SAT solver, stored in computer readable storage media, to a sequence wherein a set of control state variables is given higher priority over other variables appearing in a formula;
  selecting, using the computer processor, an order for control state variables based on increasing control path distance of corresponding control states from a target control state, wherein other variables in the formula have an order that is determined by the SAT search performed by the solver; and
  detecting and pruning, using the computer processor, infeasible path segments closer to the target control state first based on the SAT search.

9. The method as recited in claim 8, wherein a decision order of control state variables in one or more decision paths is kept fixed until the SAT search is complete.

10. The method as recited in claim 8, wherein an unassigned variable next in an order is selected.

11. The method as recited in claim 8, wherein the formula variables other than the control state variables are selected when all the control state variables are assigned.

12. A computer readable storage medium comprising a computer readable program, wherein the computer readable program when executed on a computer causes the computer to perform the steps of claim 8.

13. A system comprising:
  a processor; and
  a memory coupled to the processor and configured to execute a program for determining satisfiability of bounded model checking instance to:
    determine reachability of a target control state from an initial control state through a finite set of bounded control paths by restricting decision variable ordering of a satisfiability (SAT) search performed by a SAT solver stored in computer readable storage media to a sequence of formula variables; and selecting a set of control state variables with a higher decision priority than other formula variables in a decision path having a sequence of Boolean value assignments on unassigned variables.

14. The system as recited in claim 13, wherein the control state variables are selected in increasing order of a corresponding control state distance from the target control state.

15. The system as recited in claim 14, wherein a decision order of control state variables is kept fixed until the SAT search is complete.

16. The system as recited in claim 13, wherein an unassigned variable next in an order is selected.

17. The system as recited in claim 13, wherein infeasible control paths closest to the target control state are pruned first.

18. The system as recited in claim 13, wherein the formula variables other than the said control state variables are selected when all control state variables are assigned.

* * * * *